(12) United States Patent
Imoto et al.

(10) Patent No.: US 9,455,215 B2
(45) Date of Patent: Sep. 27, 2016

(54) SEMICONDUCTOR DEVICE AND METHOD FOR MANUFACTURING THE SAME

(71) Applicant: Mitsubishi Electric Corporation, Tokyo (JP)

(72) Inventors: Yuji Imoto, Tokyo (JP); Naoki Yoshimatsu, Tokyo (JP); Junji Fujino, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 22 days.

(21) Appl. No.: 14/222,402

(22) Filed: Mar. 21, 2014

(65) Prior Publication Data

US 2015/0061098 A1   Mar. 5, 2015

(30) Foreign Application Priority Data

Aug. 27, 2013 (JP) ................... 2013-175269

(51) Int. Cl.
| | |
|---|---|
| H01L 23/48 | (2006.01) |
| H01L 23/495 | (2006.01) |
| H01L 21/50 | (2006.01) |
| H01L 23/24 | (2006.01) |
| H01L 23/00 | (2006.01) |
| H01L 23/043 | (2006.01) |
| H01L 23/373 | (2006.01) |
| H01L 23/498 | (2006.01) |

(52) U.S. Cl.
CPC ............ *H01L 23/495* (2013.01); *H01L 21/50* (2013.01); *H01L 23/043* (2013.01); *H01L 23/24* (2013.01); *H01L 24/00* (2013.01); *H01L 24/33* (2013.01); *H01L 23/3735* (2013.01); *H01L 23/49861* (2013.01); *H01L 2224/40137* (2013.01); *H01L 2924/181* (2013.01)

(58) Field of Classification Search
CPC . H01L 23/495; H01L 23/3735; H01L 23/24; H01L 23/043; H01L 23/49861
See application file for complete search history.

(56) References Cited

U.S. PATENT DOCUMENTS

| | | | | |
|---|---|---|---|---|
| 4,305,088 A * | 12/1981 | Narita | ................. | H01L 23/4334 257/692 |
| 5,446,244 A * | 8/1995 | Kawanabe | ........... | B23K 1/0016 174/261 |
| 5,798,286 A * | 8/1998 | Faraci | ..................... | H01L 24/86 257/E21.516 |
| 5,830,782 A * | 11/1998 | Smith | ................. | H01L 21/4839 438/123 |
| 6,078,102 A * | 6/2000 | Crane, Jr. | ............. | H01L 23/053 257/693 |
| 6,406,173 B1 * | 6/2002 | Serizawa | ............. | B60Q 1/2696 362/238 |
| 7,723,846 B2 | 5/2010 | Ikawa et al. | | |
| 7,838,980 B1 * | 11/2010 | Lee | ................... | H01L 23/49551 257/692 |
| 8,158,458 B2 | 4/2012 | Ikawa et al. | | |
| 2002/0020923 A1 * | 2/2002 | Kanatake | ................ | H01L 21/56 257/778 |
| 2005/0132648 A1 * | 6/2005 | Miyahara | ............. | B01J 19/0093 48/127.9 |
| 2007/0125449 A1 * | 6/2007 | Kajiwara | ............. | B23K 35/025 148/23 |
| 2012/0032316 A1 * | 2/2012 | Nishikawa | ............ | H01L 21/565 257/676 |

FOREIGN PATENT DOCUMENTS

| | | |
|---|---|---|
| JP | 2007-081155 A | 3/2007 |
| JP | 4453498 B2 | 2/2010 |

* cited by examiner

*Primary Examiner* — Nicholas Tobergte
(74) *Attorney, Agent, or Firm* — Studebaker & Brackett PC

(57) ABSTRACT

A semiconductor device includes a conductive portion having semiconductor elements provided on a substrate, a case housing the conductive portion, and a lead terminal integrated into the case to be directly connected to the semiconductor elements or an interconnection of the substrate. The lead terminal has a stress relief shape for relieving stress generated in the lead terminal.

11 Claims, 21 Drawing Sheets

(a)

(b)

(c)

SEMICONDUCTOR DEVICE AND METHOD FOR MANUFACTURING THE SAME

BACKGROUND OF THE INVENTION

1. Field of the Invention

The present invention relates to a semiconductor device using a case and to a method for manufacturing the same.

2. Description of the Background Art

In general, a casing type power semiconductor module is formed of separate components which are an internal lead terminal inside the power semiconductor module and an external lead terminal provided in a tube part as a portion of the case (for example, see Japanese Patent Application Laid-Open No. 2007-081155).

Specifically, the internal lead terminal is connected to semiconductor elements disposed on a base plate (supporting member) by means of soldering and the like. Moreover, ends of the internal lead terminal are primary connected to a relay section in the power semiconductor module. Next, the tube part of the case is fixed to the base plate by an adhesive and the like, and the external lead terminal is secondary connected to the relay section. Thus, this structure is able to provide continuity between the semiconductor elements and an external connection terminal.

Furthermore, a general structure is that after assembling it as mentioned above, a sealing material is injected to seal the internal of the power semiconductor module.

However, the structure of the power semiconductor module as mentioned above has a great number of components, resulting in an increase in complexity. To solve the problems above, Japanese Patent Application Laid-Open No. 2006-093255 discloses a technique (hereinafter, referred to as a related technique A) for directly connecting a lead terminal (lead frame) integrated into the case to a semiconductor chip.

However, the related technique A has problems. Specifically, in the related technique A, for example, when pressure is exerted on the lead terminal and thus the lead terminal generates a great stress (resistance) in a manufacturing process, the lead terminal may become deformed in some cases. In this case, a malfunction resulting from the lead terminal may occur such that the semiconductor device serving as the power semiconductor module does not operate properly.

SUMMARY OF THE INVENTION

It is an object of the present invention to provide a semiconductor device and the like capable of suppressing the occurrence of a malfunction resulting from a lead terminal even in a case where stress is generated in the lead terminal of the semiconductor device using a case.

A semiconductor device according to an aspect of the present invention includes a conductive portion including a semiconductor element provided on a substrate, a case housing the conductive portion, and a lead terminal integrated into the case to be directly connected to the semiconductor element or an interconnection of the substrate, and the lead terminal has a stress relief shape for relieving stress generated in the lead terminal.

According to the present invention, a semiconductor device includes a conductive portion including a semiconductor element provided on a substrate, a case housing the conductive portion, and a lead terminal integrated into the case to be directly connected to the semiconductor element or an interconnection of the substrate. The lead terminal has a stress relief shape for relieving stress generated in the lead terminal. Therefore, even in a case where stress is generated in the lead terminal of the semiconductor device using the case, the occurrence of a malfunction resulting from the lead terminal can be suppressed.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
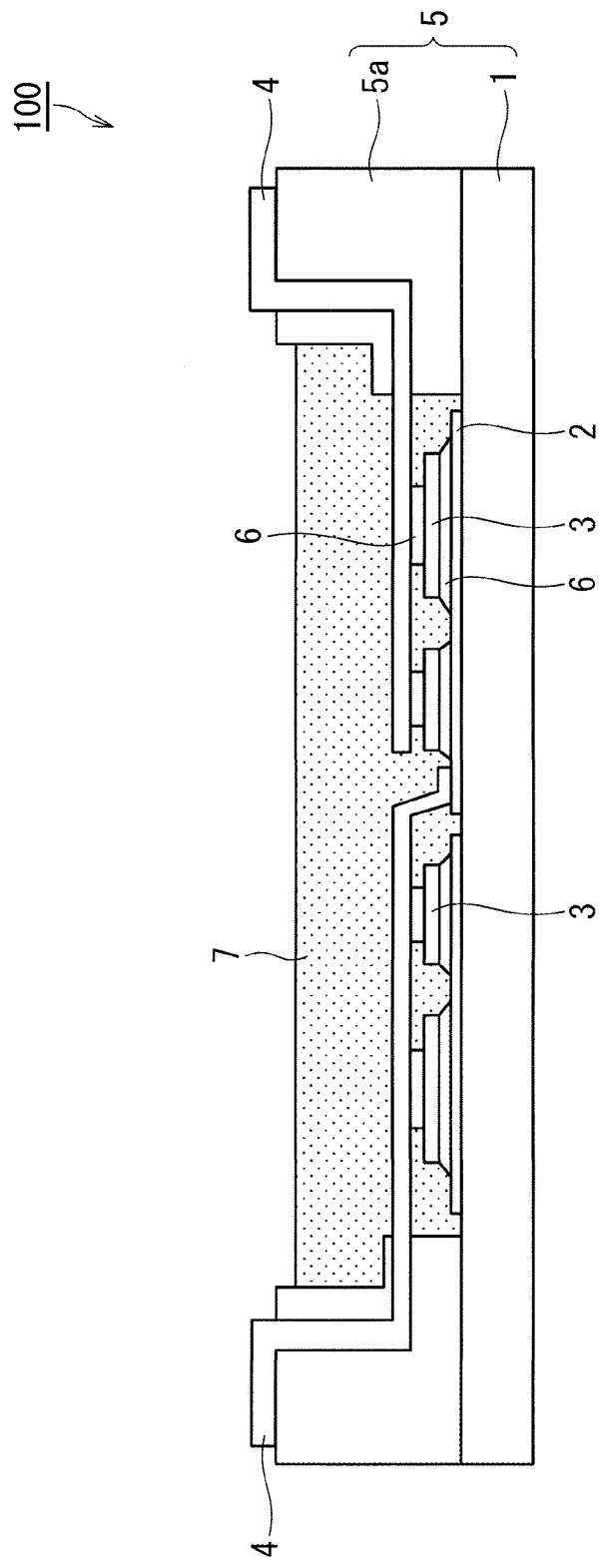
FIG. 1 is a cross sectional view of a semiconductor device according to a first preferred embodiment.

With reference to the drawings, preferred embodiments according to the present invention will be described below. In the following description, the same components have the same reference numerals. Their names and functions are also the same. Accordingly, their detailed description will be omitted in some cases.

Dimensions, materials, shapes, and relative positions of respective components shown as examples in the preferred embodiments are changed suitably depending on a structure of an apparatus to which the present invention is applied and various conditions and the present invention is not restricted to the examples. The dimensions of the respective components in the respective drawings may be different from actual dimensions.

<First Preferred Embodiment>

FIG. 1 is a cross sectional view of a semiconductor device 100 according to a first preferred embodiment. For example, the semiconductor device 100 is used for an inverter controlling electric vehicles and trains, and used for a regenerative converter. The semiconductor device 100 is mainly made of silicon carbide (SiC). To simplify the diagram, FIG. 1 shows a simplified shape of a lead terminal 4 which will be described later.

With reference to FIG. 1, the semiconductor device 100 includes a substrate 2, a plurality of semiconductor elements 3, a case 5, the lead terminal 4, and a sealing material 7.

The case 5 houses the substrate 2, the plurality of semiconductor elements 3, an interconnection which is not shown, and the like. A side surface of the case 5 has a rectangular shape. The case 5 is formed of a tubular tube part 5a and a base plate 1. The tube part 5a is made of a resin. The tube part 5a is fixed to an end on the base plate 1.

The substrate 2 is formed of an electric circuit. The substrate 2 is, for example, made of ceramic. The substrate 2 is provided on the base plate 1.

The semiconductor elements 3 are conductive portions used for operating the semiconductor device 100. The conductive portions are members in which a portion of the conductive portions or the whole conductive portions have conductivity. Moreover, an interconnection (not shown) of the substrate 2 housed in the case 5 is also a conductive portion.

A portion of the semiconductor elements 3 has conductivity. The semiconductor elements 3 are mounted on the substrate 2 through a solder 6. In other words, the semiconductor elements 3 are provided on the substrate 2. For example, the semiconductor elements 3 are wide band gap power semiconductor elements. The wide band gap power semiconductor elements are power semiconductor elements having a wide band gap. The semiconductor elements 3 are not limited to the wide band gap power semiconductor elements and may be the other power semiconductor elements.

The lead terminal 4 is integrated into the case 5. Specifically, when forming the tube part 5a of the case 5 with a resin, the lead terminal 4 is integrated into the tube part 5a.

Furthermore, the ends of the lead terminal 4 are directly connected to the semiconductor elements 3 through the solder 6. Specifically, one of ends of the lead terminal 4 is directly connected to a top surface of the semiconductor elements 3 through the solder 6.

It is not limited to the configuration above, and the end of the lead terminal 4 may be directly connected to the interconnection (not shown) of the substrate 2 without being connected to the semiconductor elements 3. In other words, the end of the lead terminal 4 is directly connected to the semiconductor elements 3 or the interconnection of the substrate 2. The end of the lead terminal 4 may be directly connected to both of the semiconductor elements 3 and the interconnection of the substrate 2.

On the other hand, the other end of the lead terminal 4 is exposed to the outside of the case 5.

Hereinafter, a portion in which the lead terminal 4 and the semiconductor elements 3 are joined (connected) is also referred to as a joint. The lead terminal 4 and the semiconductor elements 3 have the joints. In the present preferred embodiment, one of the ends of the lead terminal 4 have a plurality of joints. In addition, hereinafter, the end of the lead terminal 4 exposed to the outside of the case 5 is also referred to as an exposed part.

The sealing material 7 is, for example, made of an epoxy resin. The sealing material 7 fills the inside of the case 5. The sealing material 7 seals the plurality of semiconductor elements 3 and parts (joints) of the lead terminal 4. In other words, in the case 5, the parts (joints) of the lead terminal 4 which is connected to the semiconductor elements 3 is sealed with the sealing material 7. Thus, the reliability of the joints can be improved. The sealing material 7 is made of a material different from that of the case 5.

The sealing material 7 is not limited to the material different from that of the case 5 and may be made of the same material as that of the case 5.

Moreover, the lead terminal 4 has a stress relief shape. The stress relief shape is capable of relieving (reducing) stress generated in the lead terminal 4 in a case where pressure is applied to the lead terminal 4. One example of the stress relief shape is a crank shape. The crank shape has two connecting right angle shapes.

Figure 2:
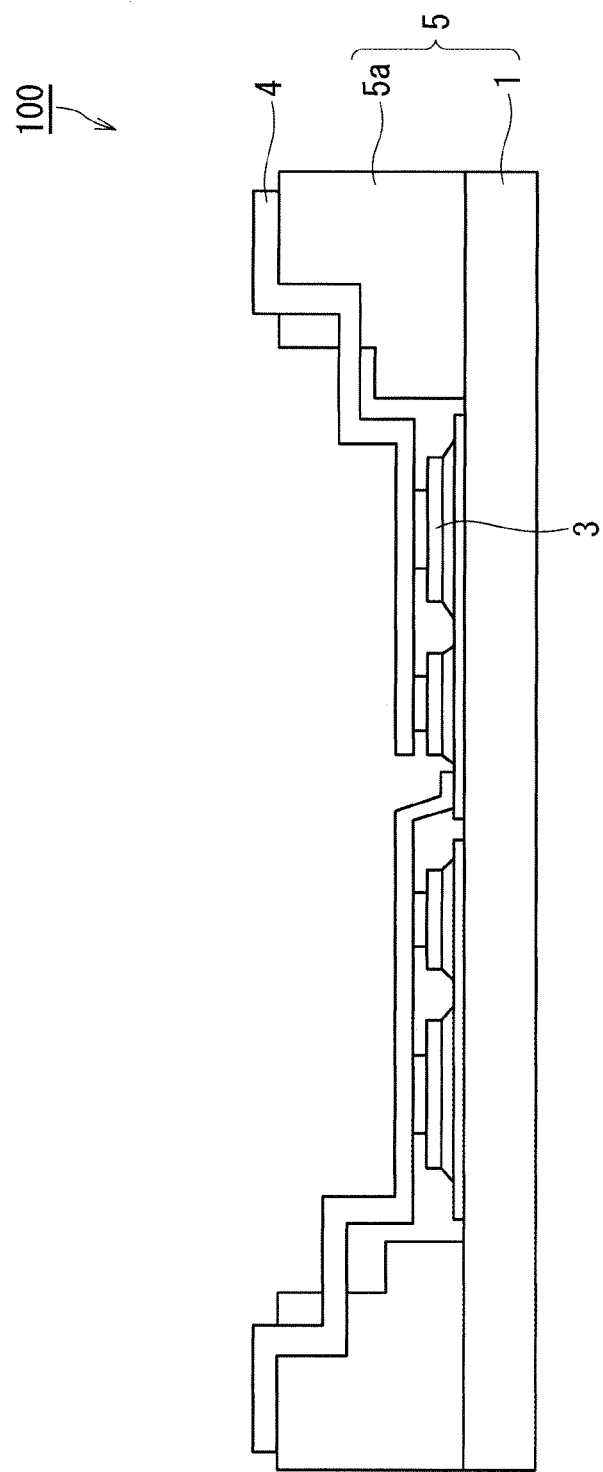
FIG. 2 is a diagram for describing a configuration of a lead terminal.

FIG. 2 is a diagram showing the lead terminal 4 having the crank shape. FIG. 2 does not show the sealing material 7 to make it easier to view the lead terminal 4. With reference to FIG. 2, the portion between the exposed part and the joints of the lead terminal 4 has the crank shape.

Figure 3:
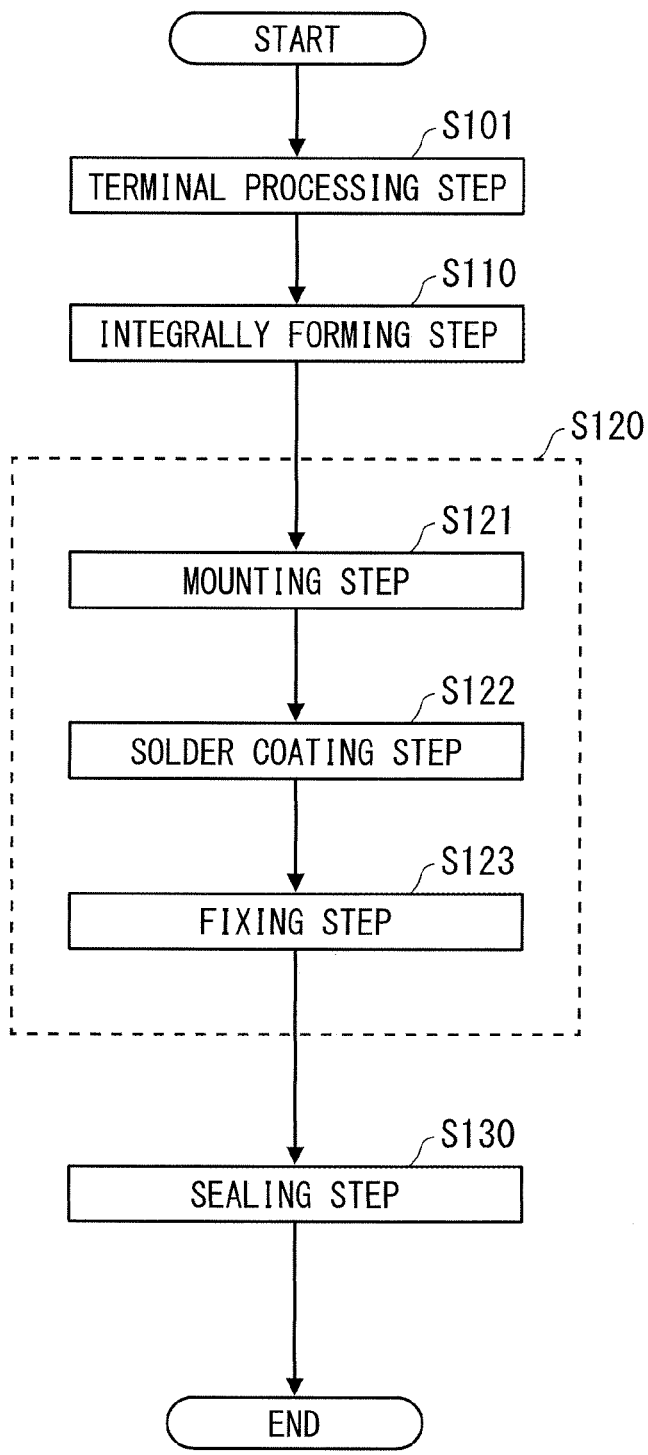
FIG. 3 is a flow chart of a manufacturing process N.
Figure 4:
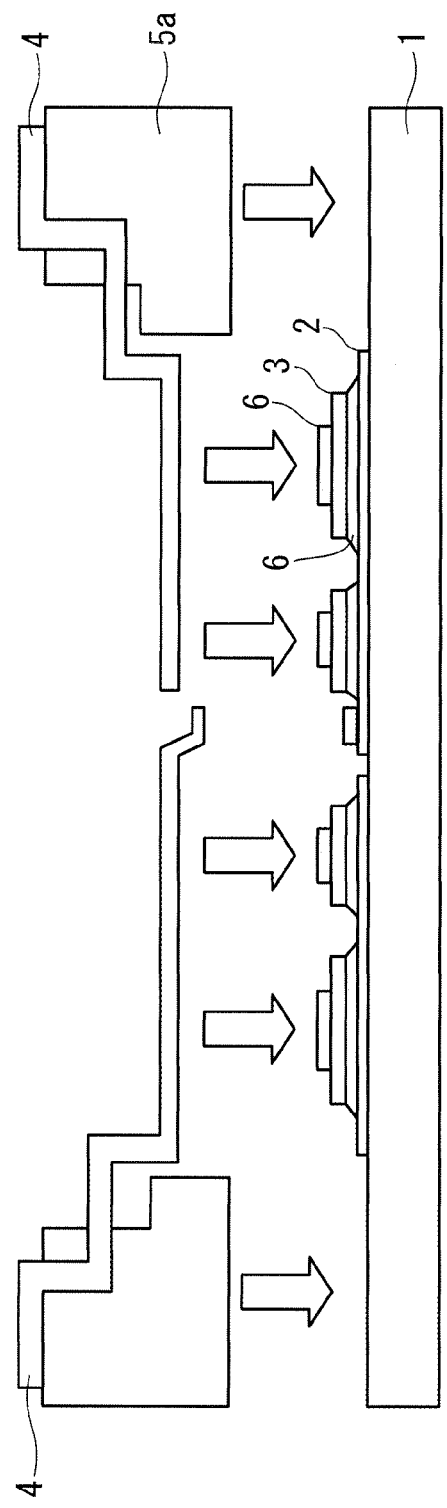
FIG. 4 is a diagram for describing the manufacturing process N.

Next, a method for manufacturing the semiconductor device 100 (hereinafter, also referred to as a manufacturing process N) will be described. FIG. 3 is a flow chart of the manufacturing process N. FIG. 4 is a diagram for describing the manufacturing process N.

With reference to FIGS. 3 and 4, first, the manufacturing process N performs a terminal processing step (S101). The terminal processing step is a step of processing the lead terminal 4 so as to have the stress relief shape as mentioned above. Specifically, in the terminal processing step, the lead terminal 4 is processed so as to have the stress relief shape.

Next, an integrally forming step (S110) is performed. In the integrally forming step, the lead terminal 4 is integrated into the tube part 5a. Specifically, as described above, when forming the tube part 5a with a resin, the lead terminal 4 is integrated into the tube part 5a.

Next, disposing steps (S120) are performed. In the disposing steps, the semiconductor elements 3 are disposed such that the semiconductor elements 3 provided on the substrate 2 are housed in the tube part 5a, and the semiconductor elements 3 are directly connected to the lead terminal 4.

Specifically, the disposing steps include a mounting step, a solder coating step, and a fixing step. In the disposing steps, first, the mounting step (S121) is performed.

In the mounting step, the semiconductor elements 3 are mounted on the base plate 1. Specifically, in the mounting step, first, the substrate 2 is fixed on the base plate 1. Next, each semiconductor element 3 is mounted on the substrate 2 through the solder 6. In other words, each semiconductor element 3 is mounted on the base plate 1 through the substrate 2.

Next, the solder coating step (S122) is performed. In the solder coating step, part of each semiconductor element 3 is provided with the solder 6. Specifically, in the solder coating step, as shown in FIGS. 2 and 4, an upper surface of each semiconductor element 3 and a portion of the substrate 2 which is connected to the lead terminal 4 are provided with the solder 6. The solder 6 is provided on the upper surface and the like of each semiconductor element 3 by melting, ultrasonic bonding, and the like. In other words, as described later, prior to fixing the tube part 5*a* to the base plate 1, the semiconductor elements 3 are provided with the solder 6 in advance.

In the solder coating step, a place provided with the solder 6 is not limited to the place as mentioned above. For example, the solder coating step may have a configuration in which part of the lead terminal 4 is provided with the solder 6 (hereinafter, also referred to as a modified configuration N).

In the solder coating step having the modified configuration N, the part of the lead terminal 4 integrated into the tube part 5*a* is provided with the solder 6. Specifically, in the solder coating step having the modified configuration N, a portion of the lead terminal 4 which is connected to the substrate 2 and a portion of the lead terminal 4 which is connected to the upper surface of each semiconductor element 3 are provided with the solder 6.

Next, a fixing step (S123) is performed. In the fixing step, to directly connect the lead terminal 4 to the semiconductor elements 3 through the solder 6, the tube part 5*a* is fixed to the base plate 1.

Specifically, in the fixing step, to connect the lead terminal 4 to the upper surface of each semiconductor element 3 and the part of the substrate 2 through the solder 6, the tube part 5*a* is fixed to the base plate 1. Because of the fixing step, the adhesion between the tube part 5*a* and the base plate 1 and the bonding between the semiconductor elements 3 and the lead terminal 4 can be achieved simultaneously.

As described above, the end of the lead terminal 4 may be configured to be directly connected to the interconnection (not shown) of the substrate 2 without being connected to the semiconductor elements 3. In a case of this configuration, in the disposing steps (S120) as described above, a conductive portion is disposed such that the conductive portion including the semiconductor elements 3 provided on the substrate 2 is housed in the tube part 5*a*, and the interconnection of the substrate 2 is directly connected to the lead terminal 4.

In addition, as described above, the end of the lead terminal 4 may be configured to be directly connected to both of the semiconductor elements 3 and the interconnection of the substrate 2. In a case of this configuration, in the disposing steps (S120) as described above, the conductive portion is disposed such that the conductive portion including the semiconductor elements 3 provided on the substrate 2 and the interconnection of the substrate 2 is housed in the tube part 5*a*, and the semiconductor elements 3 and the interconnection of the substrate 2 are directly connected to the lead terminal 4.

Next, the sealing step (S130) is performed. In the sealing step, as shown in FIG. 2, the sealing material 7 fills the space inside of the case 5 formed of the tube part 5*a* and the base plate 1. Consequently, the manufacturing process N is completed, and the semiconductor device 100 is manufactured.

As described above, according to the present preferred embodiment, the semiconductor device 100 is provided with the conductive portion including the semiconductor elements 3 provided on the substrate 2, the case 5 housing the conductive portion, and the lead terminal 4 integrated into the case 5 to be directly connected to the semiconductor elements 3 or the interconnection of the substrate 2. The lead terminal 4 has the stress relief shape for relieving the stress generated in the lead terminal 4.

Thus, even in the case where the stress is generated in the lead terminal 4 of the semiconductor device 100 using the case 5, the occurrence of a malfunction resulting from the lead terminal 4 can be suppressed.

Furthermore, since the lead terminal 4 has the stress relief shape, variations in height of the joints of the lead terminal 4 and stress in the joints of the lead terminal generated by the contraction of the sealing material 7 can be reduced, for example. Moreover, stress in the lead terminal generated by deformation of the case, elastic deformation of the lead terminal during soldering, and the like can be relieved (reduced). As a result, the quality of the joints can be stabilized, and separation of the sealing material can be suppressed. Therefore, the reliability of the joints can be improved.

Figure 5:
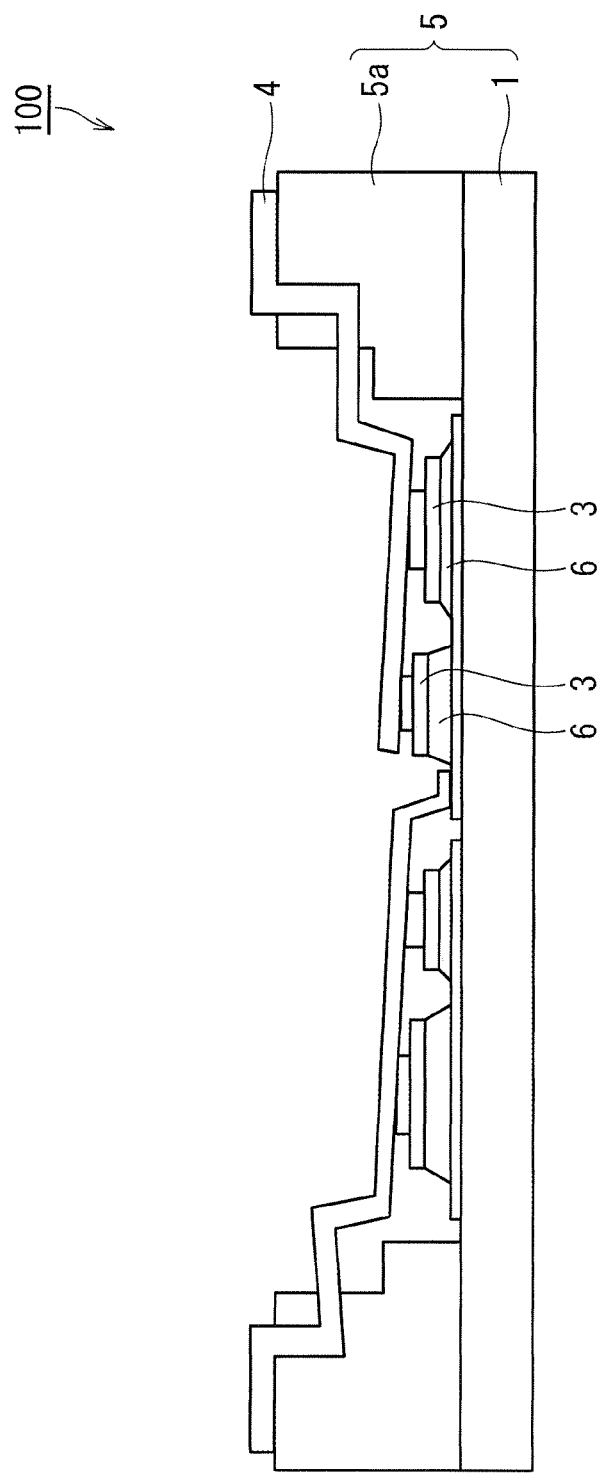
FIG. 5 is a diagram for describing effects of a stress relief shape.

According to the present preferred embodiment, the lead terminal 4 has the crank shape (stress relief shape). For example, FIG. 5 shows a case where there are variations in thickness (height) of the solder 6 fixing each semiconductor element 3 to the substrate 2. In other words, the thickness of the solder 6 below each semiconductor element 3 varies, whereby the height of the joints of each semiconductor element 3 adjacent to each other varies.

In this case, the lead terminal 4 having the crank shape (stress relief shape) is elastically deformed, so that the stress generated in the lead terminal 4 is relieved. Thus, a difference in height of the each joint can be absorbed.

Therefore, reaction force generated in an adhesive surface between the tube part 5*a* and the base plate 1 is reduced, so that a stable joint state can be created. Moreover, contraction of the sealing material 7 after sealing enables the stress generated in each joint to be reduced. Thus, the reliability of the joints can be improved.

According to the present preferred embodiment, since the lead terminal 4 is integrated into the tube part 5*a*, an additional internal lead terminal joining the semiconductor elements 3 is unnecessary. As a result, the number of components forming the semiconductor device 100 can be reduced. Therefore, the size of the semiconductor device 100 can be reduced. In other words, the miniaturization and the weight reduction of the semiconductor device 100 can be achieved.

Furthermore, according to the manufacturing process N of the present preferred embodiment, as shown in FIG. 4, the adhesion between the tube part 5*a* and the base plate 1 and the bonding between the semiconductor elements 3 and the lead terminal 4 can be achieved simultaneously. Thus, the manufacturing process of the semiconductor device 100 can be reduced. In other words, the method for manufacturing the semiconductor device 100 can be simplified (assembly).

The fixing step is performed after providing the semiconductor elements 3 or the lead terminal 4 with the solder 6 in advance, so that in contrast to a solder paste, the thickness of the solder 6 can be secured more uniform.

According to the present preferred embodiment, the semiconductor elements 3 used in the semiconductor device 100 are the wide band gap semiconductor elements. Thus, a stable operation can be achieved even in a state at high temperatures.

The related technique A cannot solve the problem that the height in the joint surfaces of the surfaces of the semiconductor elements varies due to variations in thickness of the solder below the semiconductor elements mounted on the substrate. This problem can be solved by the configuration in which the internal lead terminal is not directly connected to the external lead terminal provided in the case, and the internal lead terminal and the external lead terminal are separately connected to the relay section provided in the case. However, with this configuration, an area for the relay section is necessary in addition, so that a floor area of the base plate needs to be increased, thereby increasing the size of the module.

Moreover, the related technique A cannot solve the problem that the gap between the connection surface of the semiconductor elements and the connection surface of the internal lead terminal is increased because the position of the lead terminal varies due to the contraction of the case.

The related technique A cannot solve the problem that after sealing the joints of the lead terminal with the sealing material, adhesion properties between the surface of the lead terminal and the sealing material deteriorate because of the difference in a linear expansion coefficient between the sealing material and the lead terminal, whereby the sealing material is separated from the lead terminal.

On the other hand, according to the present preferred embodiment, the semiconductor device 100 is configured as described above, so that it is capable of solving the above problems which cannot be solved by the related technique A.

The adhesion between the tube part 5a and the base plate 1 and the bonding between the semiconductor elements 3 and the lead terminal 4 may not be achieved simultaneously and may be achieved separately. This configuration can also achieve an effect of reducing the number of components and a simplification of a manufacturing process.

In the present preferred embodiment, the lead terminal 4 has the stress relief shape which is the crank shape. However, the shape is not limited to this. For example, as shown in part (a) in FIG. 6, the lead terminal 4 may have a multi-stage crank shape formed of a plurality of crank shapes for the stress relief shape.

Figure 6:
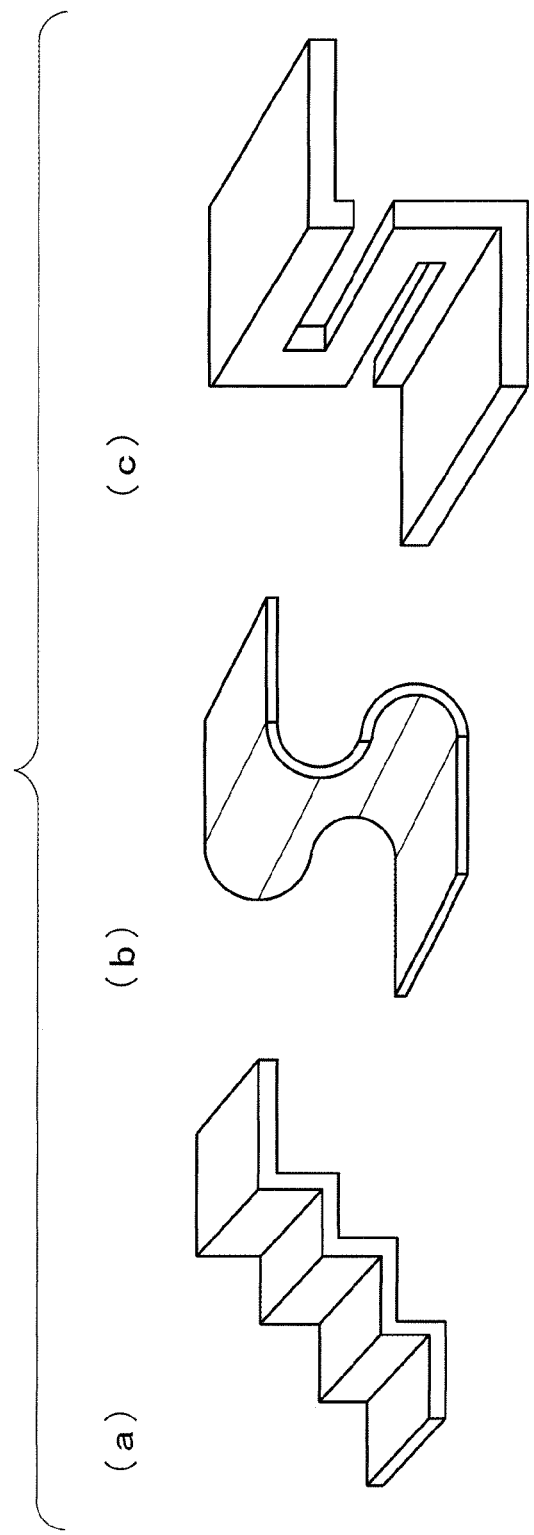
FIG. 6 is a diagram showing an example of a plurality of the stress relief shapes.

For example, as shown in part (b) in FIG. 6, the lead terminal 4 may have an S-bend shape for the stress relief shape. For example, as shown in part (c) in FIG. 6, the lead terminal 4 may have a bend shape for the stress relief shape.

In the present preferred embodiment, at the time of resin molding, the lead terminal 4 is configured to be integrated into the case 5 (tube part 5a). However, it is not limited to this. For example, after forming the case 5 (tube part 5a), the lead terminal 4 is press-fitted, so that the lead terminal 4 may be retrofitted to the case 5 (tube part 5a).

According to the present preferred embodiment, the relay section is not necessary to be provided as conventionally. For this reason, the space for the relay section is unnecessary, and thus the semiconductor device 100 can be made compact in size compared to the conventional configuration provided with the relay section. In addition, it is not required to join the relay section as conventionally, which can prevent a malfunction such as an increase in the interconnection resistance due to a deterioration of joining quality of the lead terminal in this section.

The joints between the semiconductor elements 3 and the substrate 2, and the joints between the semiconductor elements 3 and the lead terminal 4 are joined with the solder 6. It may be an ultrasonic bonding instead of using the solder 6.

The sealing material 7 is not limited to the epoxy resin, and it may be, for example, a silicon gel and the other resins.

<First Modification of First Preferred Embodiment>

A first modification of the present preferred embodiment will describe a configuration in which the lead terminal 4 is connected to an external bus bar 9 serving as an external terminal (hereinafter, also referred to as a modified configuration A). The modified configuration A may be applied to any of a second modification of the first preferred embodiment, and the second to fourth preferred embodiments as described later.

Figure 7:
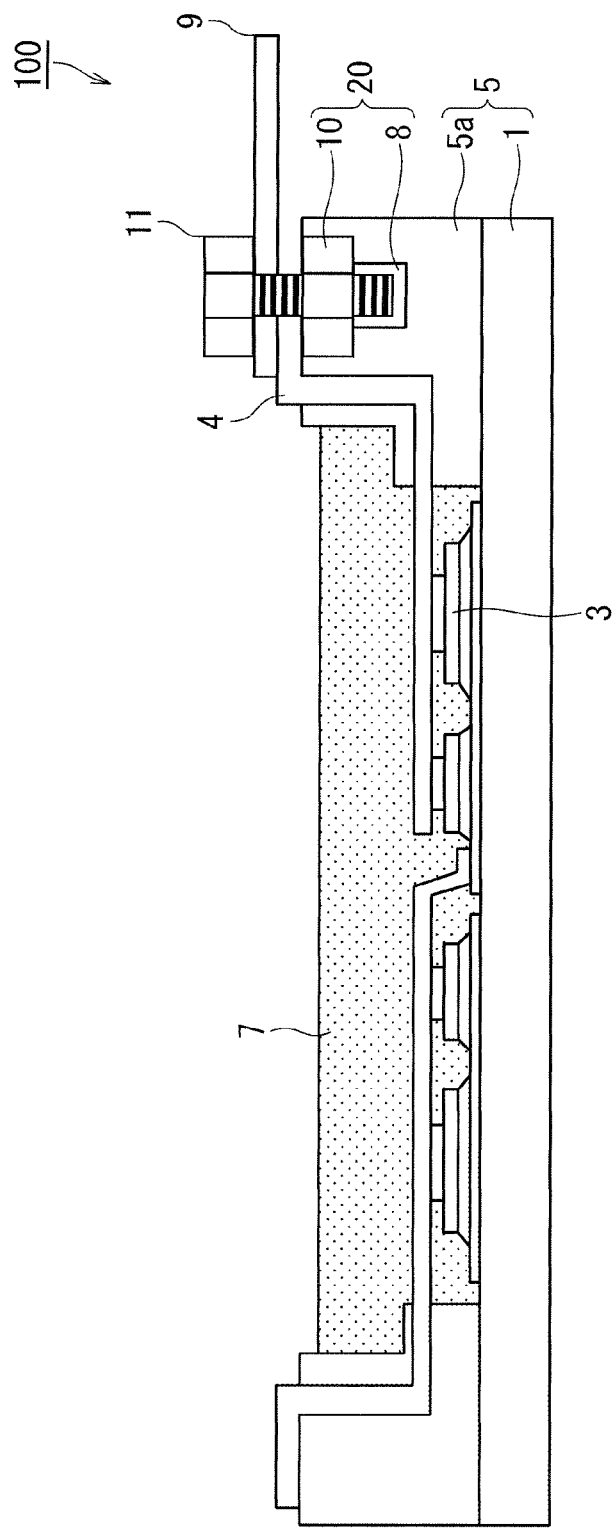
FIG. 7 is a cross sectional view of the semiconductor device according to a first modification of the first preferred embodiment of the present invention.

FIG. 7 is a cross sectional view of the semiconductor device 100 according to the first modification of the first preferred embodiment of the present invention. To simplify the diagram, FIG. 7 shows a simplified shape of the lead terminal 4. The lead terminal 4 of the semiconductor device 100 according to the first modification of the present preferred embodiment has the stress relief shape as in the first preferred embodiment.

Figure 8:
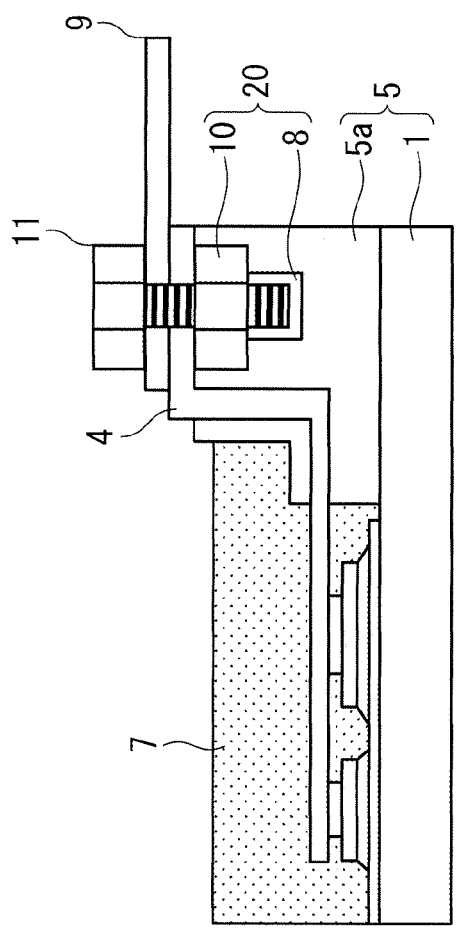
FIG. 8 is an enlarged view of the semiconductor device according to the first modification of the first preferred embodiment of the present invention.

FIG. 8 is an enlarged view of the semiconductor device 100 having the modified configuration A. The semiconductor device 100 having the modified configuration A is configured to freely connect to the bus bar 9 serving as the external terminal. With this configuration, the semiconductor device 100 having the modified configuration A is connected to the outside through the bus bar 9 serving as the external terminal. As mentioned above, the end of the lead terminal 4 exposed to the outside of the case 5 is also referred to as the exposed part.

With reference to FIGS. 7 and 8, in the semiconductor device 100 having the modified configuration A, an external connection part 20 is integrated into the case 5 (tube part 5a) exposed to the outside. The external connection part 20 is a portion for connecting the bus bar 9 to the end (exposed part) of the lead terminal 4. The external connection part 20 is integrated into the tube part 5a when forming the tube part 5a with the resin. The external connection part 20 is formed of a terminal block 8 and a nut 10. The nut 10 is inserted into the terminal block 8.

The nut 10 and a bolt 11 of the external connection part 20 sandwich the bus bar 9 and the lead terminal 4. Thus, the lead terminal 4 and the bus bar 9 are connected.

According to the first modification of the present preferred embodiment, the case 5 (tube part 5a) exposed to the outside is provided with the external connection part 20, whereby the lead terminal 4 can be easily connected to the bus bar 9 (external terminal). Thus, the external terminal block becomes unnecessary, which allows for the miniaturization of the semiconductor device 100.

A method for fixing the bus bar 9 may be configured to use a welding method, a riveting method, and the like. With this configuration, the similar effects can also be obtained. In the first modification of the present preferred embodiment, when forming the tube part 5a with the resin, the terminal block 8 (external connection part 20) is integrated into the case 5 (tube part 5a). However, it is not limited to this configuration. The external connection part 20 may be retrofitted to be integrated into the case 5. With this configuration, the similar effects can also be obtained.

<Second Modification of First Preferred Embodiment>

A second modification of the present preferred embodiment will describe a configuration in which a cooling fin 12 is fixed to the base plate 1 (hereinafter, also referred to as a modified configuration B). The modified configuration B may be applied to any of the first preferred embodiment, the first modification of the first preferred embodiment, and the second to fourth preferred embodiments as described later.

Figure 9:
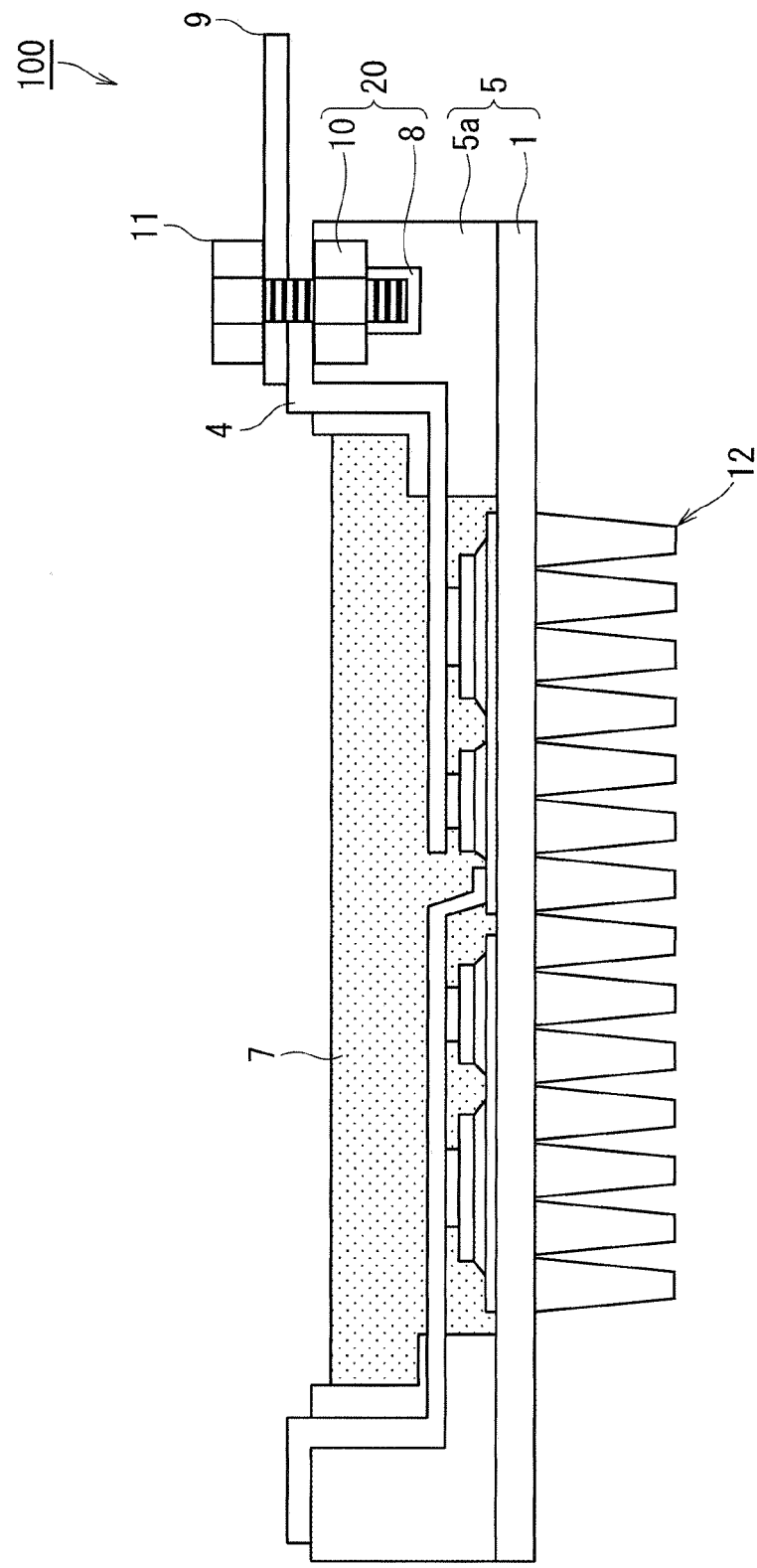
FIG. 9 is a cross sectional view of the semiconductor device according to a second modification of the first preferred embodiment of the present invention.

FIG. 9 is a cross sectional view of the semiconductor device 100 according to a second modification of the first preferred embodiment of the present invention. The semiconductor device 100 as shown in FIG. 9 has the modified configuration B and the modified configuration A. To simplify the diagram, FIG. 9 shows a simplified shape of the lead terminal 4. The lead terminal 4 of the semiconductor device 100 according to the second modification of the present preferred embodiment has the stress relief shape as in the first preferred embodiment.

With reference to FIG. 9, the semiconductor device 100 further includes the cooling fin 12. The cooling fin 12 has a function of dissipating heat. The cooling fin 12 is fixed to a lower surface of the base plate 1. In other words, the cooling fin 12 is integrated into the case 5. Because of this configuration, the semiconductor device 100 is capable of cooling with efficiency.

Furthermore, since the cooling fin 12 is integrated into the case 5, the semiconductor device 100 can be made more compact. The semiconductor device 100 also has the modified configuration A as described above in addition to the modified configuration B. Thus, for example, the terminal block is unnecessary to be formed on the side of an inverter unit for vehicle, thereby enhancing the convenience.

Figure 10:
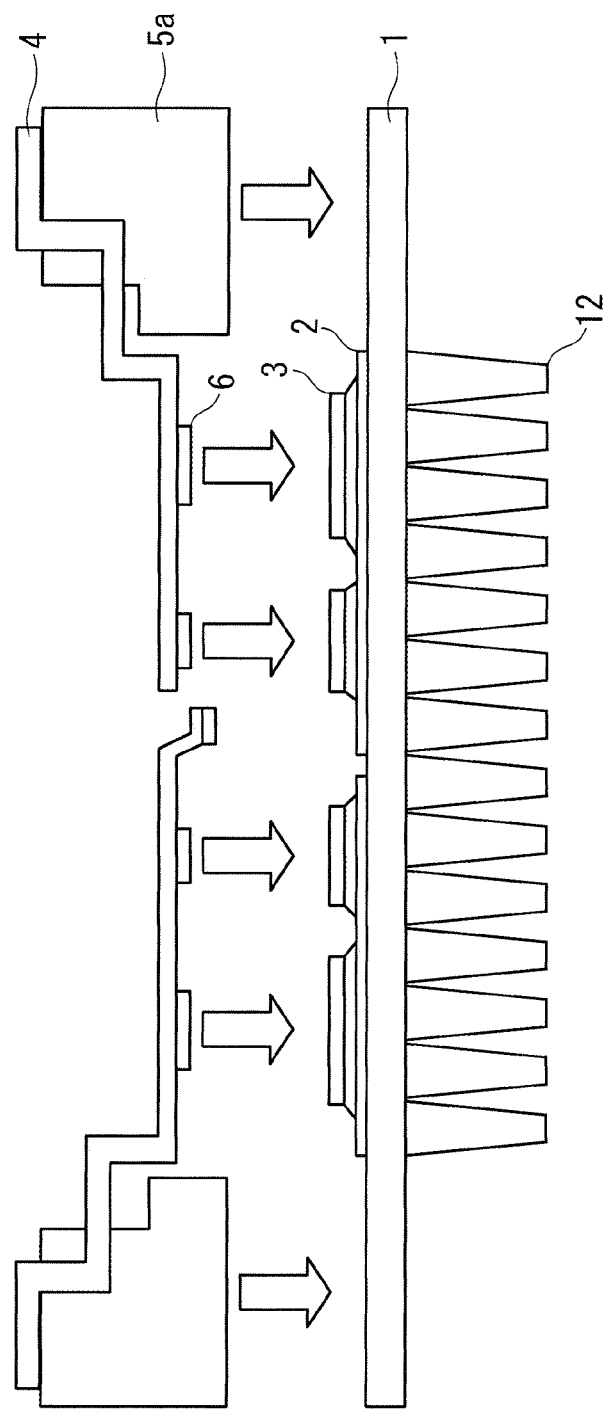
FIG. 10 is a diagram for describing the manufacturing process N.

In the manufacturing process N of the first preferred embodiment, the method for manufacturing the semiconductor device 100 having the modified configuration B is different only in that the base plate 1 having the cooling fin 12 fixed thereon in advance is used instead of the base plate 1 as shown in FIG. 10.

The semiconductor device 100 according to the second modification of the first preferred embodiment has the modified configuration B and the modified configuration A, and it may be configured to have the modified configuration B without the modified configuration A.

<Second Preferred Embodiment>

Figure 11:
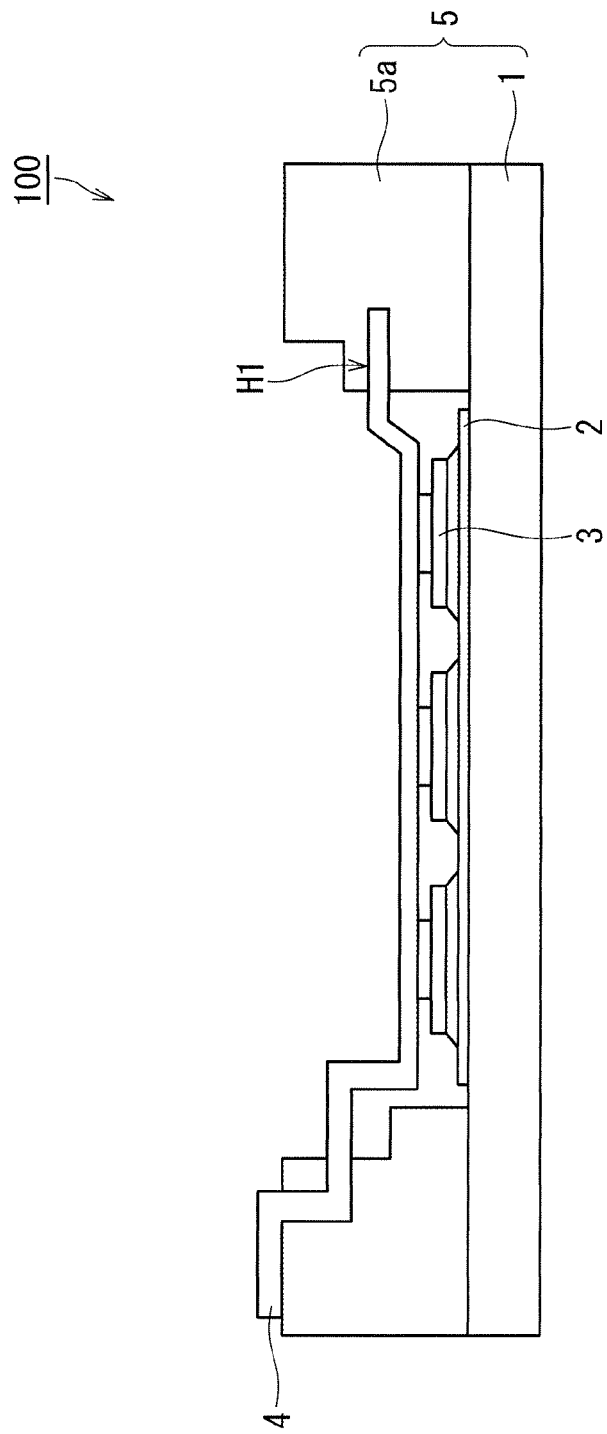
FIG. 11 is a cross sectional view of the semiconductor device according to a second preferred embodiment of the present invention.

FIG. 11 is a cross sectional view of the semiconductor device 100 according to a second preferred embodiment of the present invention. To simplify the diagram, FIG. 11 does not show the sealing material 7 and shows the semiconductor elements 3 less than the number of the semiconductor elements 3 in the configuration of FIG. 2.

As described above, the portion in which the lead terminal 4 and the semiconductor elements 3 are joined (connected) is also referred to as the joint. Hereinafter, the end except for the exposed part of two ends of the lead terminal 4 is also referred to as an internal end. The detail will be described later, and the internal end is fixed to the inside of the case 5.

In the present preferred embodiment, a plurality of semiconductor elements 3 join a middle part of the lead terminal 4. In the present preferred embodiment, a hole H1, which is provided for the internal end of the lead terminal 4 to insert thereinto, is provided on a side surface of the case 5. The internal end of the lead terminal 4 is inserted into the hole H1. In other words, the internal end of the lead terminal 4 is buried in the case 5.

The lead terminal 4 of the semiconductor device 100 according to the present preferred embodiment has the stress relief shape as in the first preferred embodiment.

Figure 12:
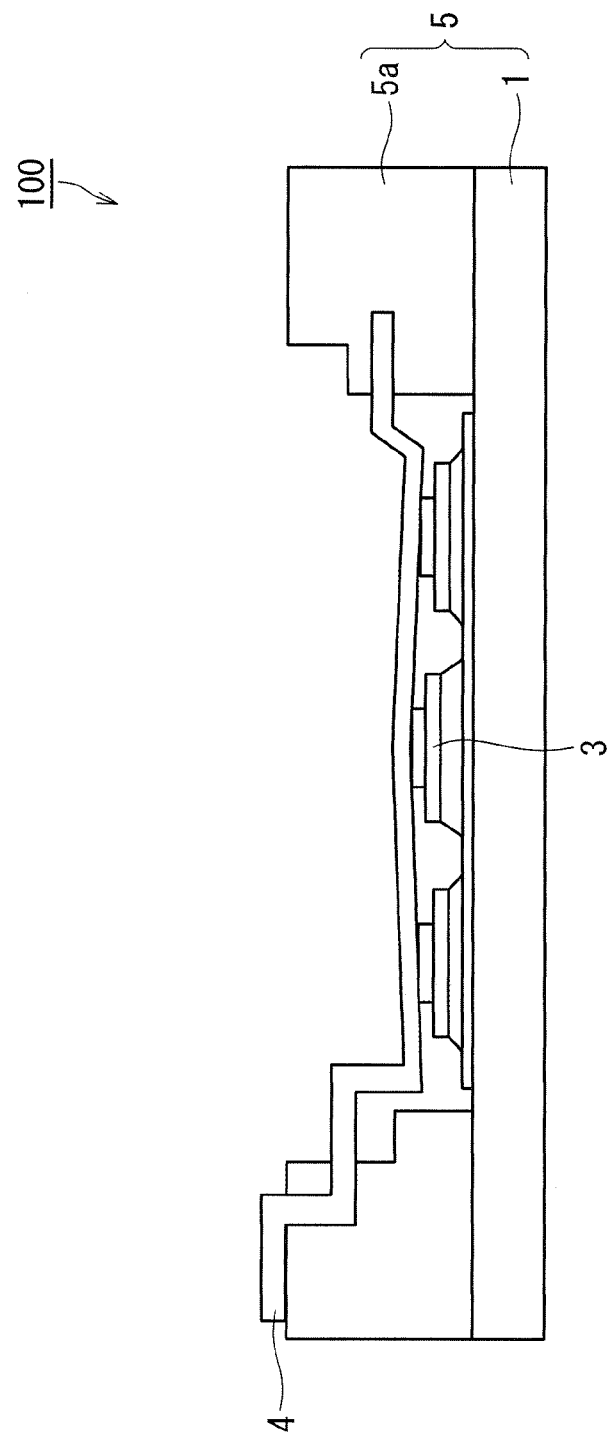
FIGS. 12 and 13 are diagrams for describing effects of the semiconductor device according to the second preferred embodiment.

As shown in FIG. 12, the semiconductor element 3 placed in the middle below the solder 6 has a greater thickness than that of the other semiconductor elements 3 below the solder 6. In other words, the joint of the semiconductor element 3 in the middle of the three semiconductor elements 3 has a higher joint than the joints of the other semiconductor elements 3.

In this case, the semiconductor element 3 in the middle lifts the lead terminal 4, however, two places which are the internal end of the lead terminal 4 and the exposed part of the lead terminal 4 are fixed to the case 5. Thus, deformation of the lead terminal 4 is suppressed, whereby the lead terminal 4 can be connected to an upper surface of the semiconductor elements 3 with reliability.

Figure 13:
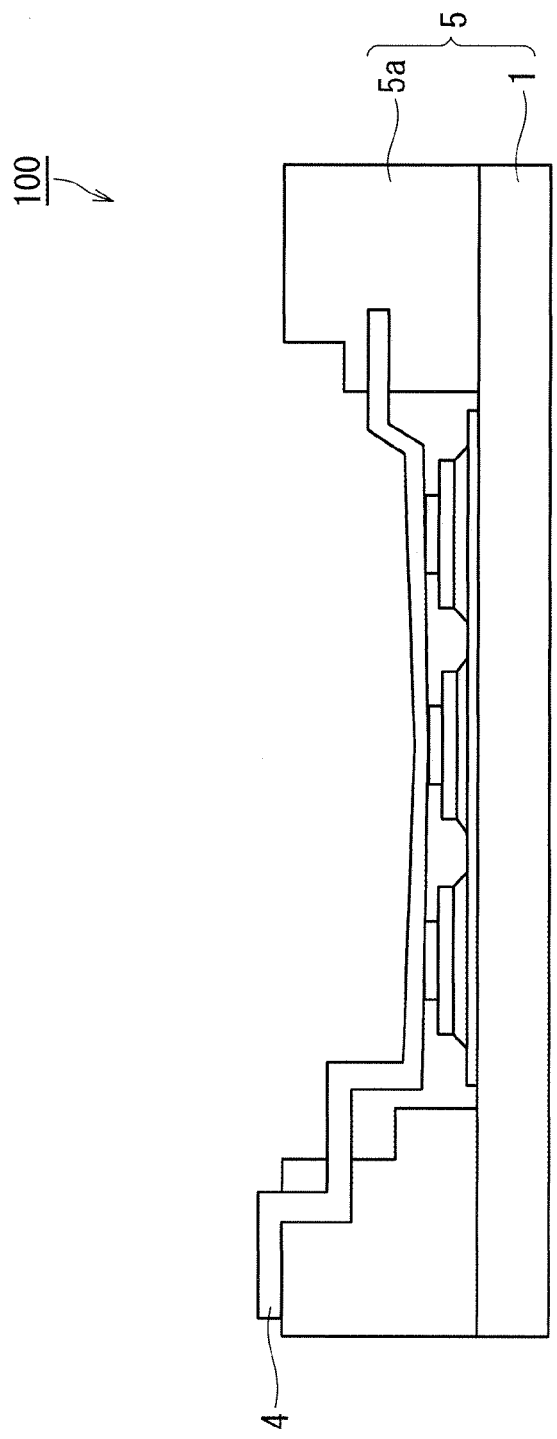

As shown in FIG. 13, the semiconductor elements 3 placed on both sides have higher joints than that of the semiconductor element 3 in the middle. In other words, the joint of the semiconductor device 3 in the middle is lower than the joints of the other semiconductor elements 3.

In this case, force is applied beforehand to the lead terminal 4 in a substantially downward direction to form the lead terminal 4 into a V-shape. Thus, the lead terminal 4 can be connected to each upper surface of the semiconductor elements 3 with reliability. This shape has no effects on the case in FIG. 11. The stress relief shape as described above is further added to this shape, whereby an excellent effect can be obtained.

Figure 21:
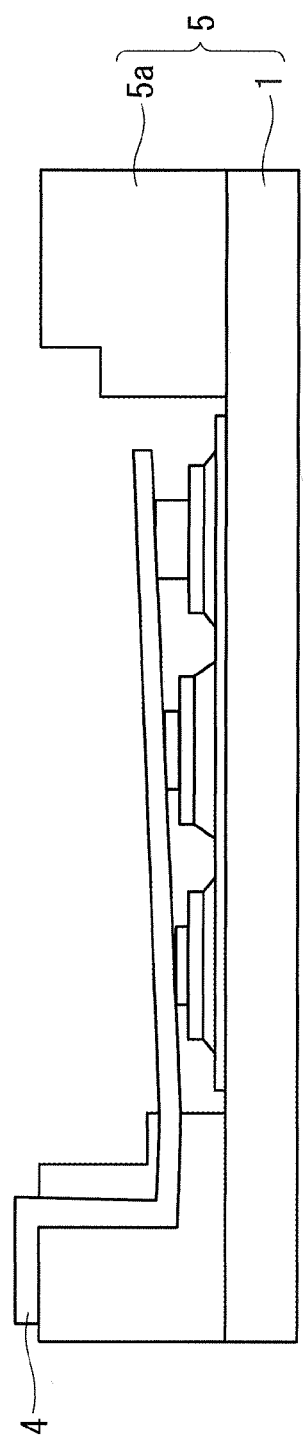
FIG. 21 is a diagram for describing a configuration in which an internal end of the lead terminal is not fixed.

FIG. 21 is a diagram for describing a case in which the internal terminal of the lead terminal 4 is not configured to be fixed. As shown in FIG. 21, in the case where the internal terminal of the lead terminal 4 is not fixed, the height in each joint of the lead terminal 4 varies. With this configuration, it is a problem that the joints between the lead terminal 4 and the semiconductor elements 3 are uncertain.

On the other hand, in the present preferred embodiment, the internal terminal of the lead terminal 4 is fixed to the case 5, so that the problem in the configuration as shown in FIG. 21 can be solved.

According to the present preferred embodiment, the both ends of the lead terminal 4 are fixed to the case 5. For this reason, variations in the position of the lead terminal 4 with respect to the case 5 can be suppressed. Thus, variations in the height of each joint can be suppressed. Therefore, the precision of the thickness of the solder 6 on the semiconductor elements 3 can be improved. As a result, the reliability of the joints can be improved, variations in thermal resistance and the like can be suppressed, and losses can be reduced.

The present preferred embodiment describes the configuration in which the three semiconductor elements 3 join the lead terminal 4, and the present preferred embodiment is not limited to this. In this preferred embodiment, the internal terminal of the lead terminal 4 is fixed, whereby the height of the lead terminal 4 can be controlled with stability. Consequently, the number of the semiconductor elements 3 joining the lead terminal 4 can range from one to the plural number.

The number of the holes H1 which the internal terminal of the lead terminal 4 inserts into is not limited to one, and it may be configured to provide more than one for necessary positions. With this configuration, the internal terminal of the lead terminal 4 can be fixed more firmly.

The semiconductor device 100 according to the present preferred embodiment may have both of the modified configurations A and B as described above, or one of the modified configurations A and B.

<Third Preferred Embodiment>

The present preferred embodiment will describe a configuration in which a slit is provided in the lead terminal 4 (hereinafter, also referred to as a modified configuration C). The modified configuration C may be applied to any of the first preferred embodiment, the first and the second modifications of the first preferred embodiment, the second preferred embodiment, and a fourth preferred embodiment as described later.

Figure 14:
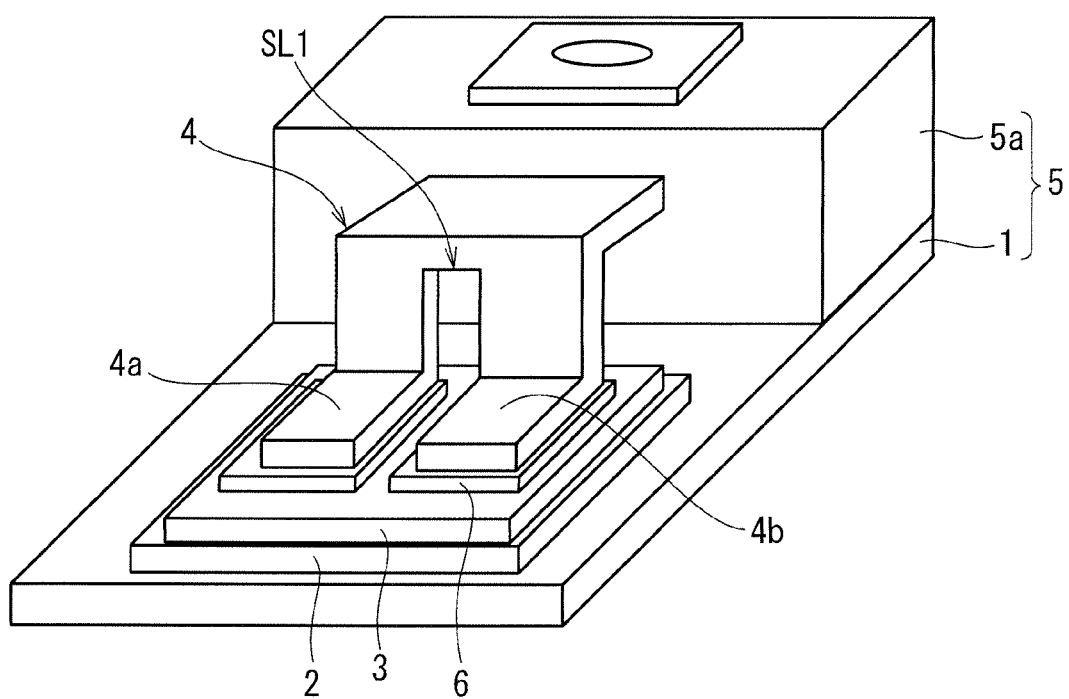
FIG. 14 is a perspective view showing a configuration of the lead terminal according to a third preferred embodiment of the present invention.

FIG. 14 is a perspective view showing a configuration of the lead terminal 4 according to a third preferred embodiment of the present invention. Specifically, FIG. 14 is the perspective view showing part of the semiconductor device 100 using the lead terminal 4 including a slit SL1. FIG. 14 shows a simplified right-half of the configuration in FIG. 2.

With reference to FIG. 14, the lead terminal 4 is provided with the slit SL1 such that one semiconductor element 3 has joints 4a and 4b. The joints 4a and 4b of the lead terminal 4 are each connected to the semiconductor elements 3 through the solder 6. The lead terminal 4 is configured such that the joints 4a and 4b are independently movable in up and down direction to absorb a difference in height of the respective solder 6.

In a case where the lead terminal 4 has a wide connection place on the semiconductor elements 3 and where the lead terminal 4 is simultaneously connected to a plurality of places of the semiconductor elements 3, the height of each joint may vary.

Figure 15:
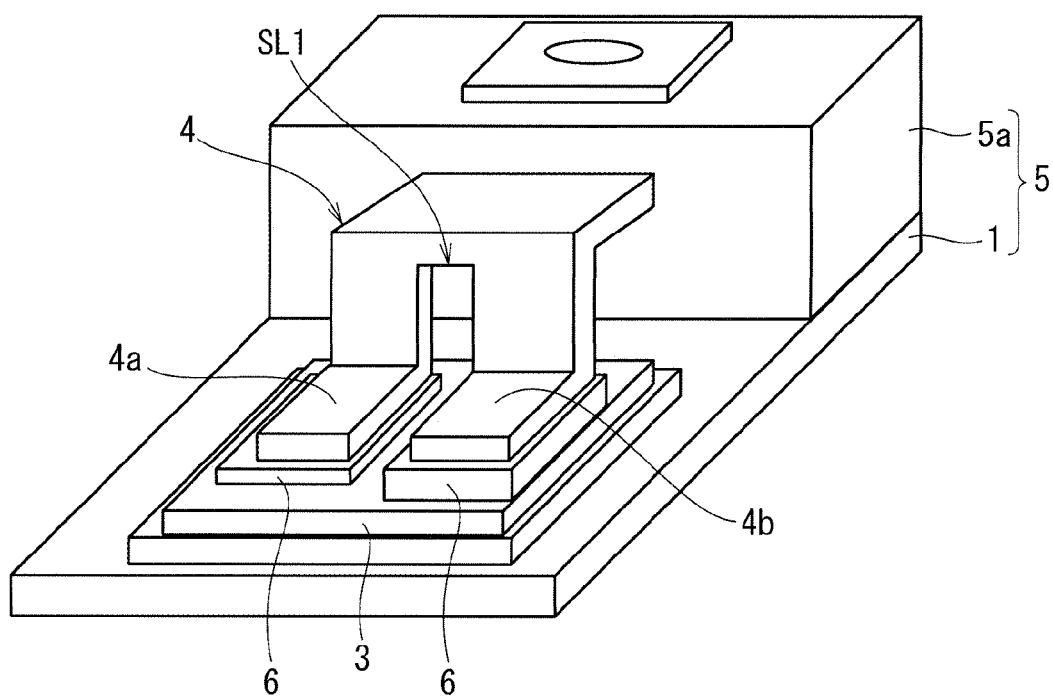
FIG. 15 is a diagram for describing effects of the lead terminal according to the third preferred embodiment.

As one of examples shown in FIG. 15, the solder 6 has a sufficiently greater thickness under the joint 4b than that of the solder 6 under the joint 4a. Even in this case, each of the joints 4a and 4b of the lead terminal 4 are independently movable in up and down direction. Thus, variations in the height of the joints can be absorbed, which allows for a reliable connection between the lead terminal 4 and the semiconductor elements 3. Moreover, the stress generated in the joints can be relieved, so that the reliability of the joints can be improved.

The present preferred embodiment describes the configuration in which the lead terminal 4 is connected to the upper surface of the semiconductor elements 3, and the lead terminal 4 of the modified configuration C may be configured to be connected onto the substrate 2. In a case of this configuration, for example, even if the substrate 2 is inclined, the excellent effect can be obtained that the lead terminal 4 can be connected to the substrate 2 with reliability.

Figure 16:
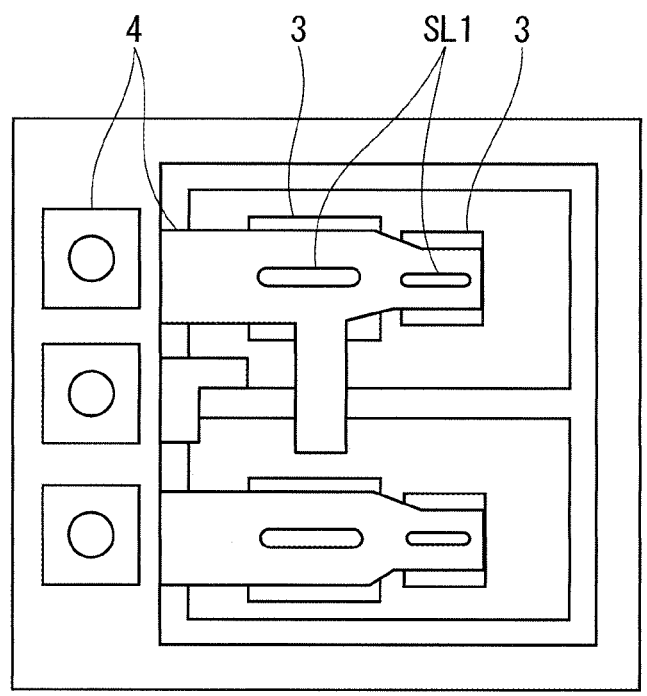
FIG. 16 is a plan view showing a modification of the lead terminal according to the third preferred embodiment of the present invention.

The position of the slit SL1 is not limited to that shown in FIG. 14. For example, as shown in FIG. 16, part (joint) of the lead terminal 4 which the semiconductor elements 3 join may be provided with a slit SL1. FIG. 16 is a diagram seen from above the configuration of FIG. 14.

Similarly, with this configuration, variations in the height of the portion adjacent to the slit SL1 can be absorbed, whereby an excellent connection state between the lead terminal 4 and the semiconductor elements 3 can be obtained.

<Fourth Preferred Embodiment>

The present preferred embodiment will describe a configuration in which the lead terminal 4 is provided with a through-hole (hereinafter, also referred to as a modified configuration D). The modified configuration D may be applied to any of the first preferred embodiment, the first and the second modifications of the first preferred embodiment, and the second and third preferred embodiments.

Figure 17:
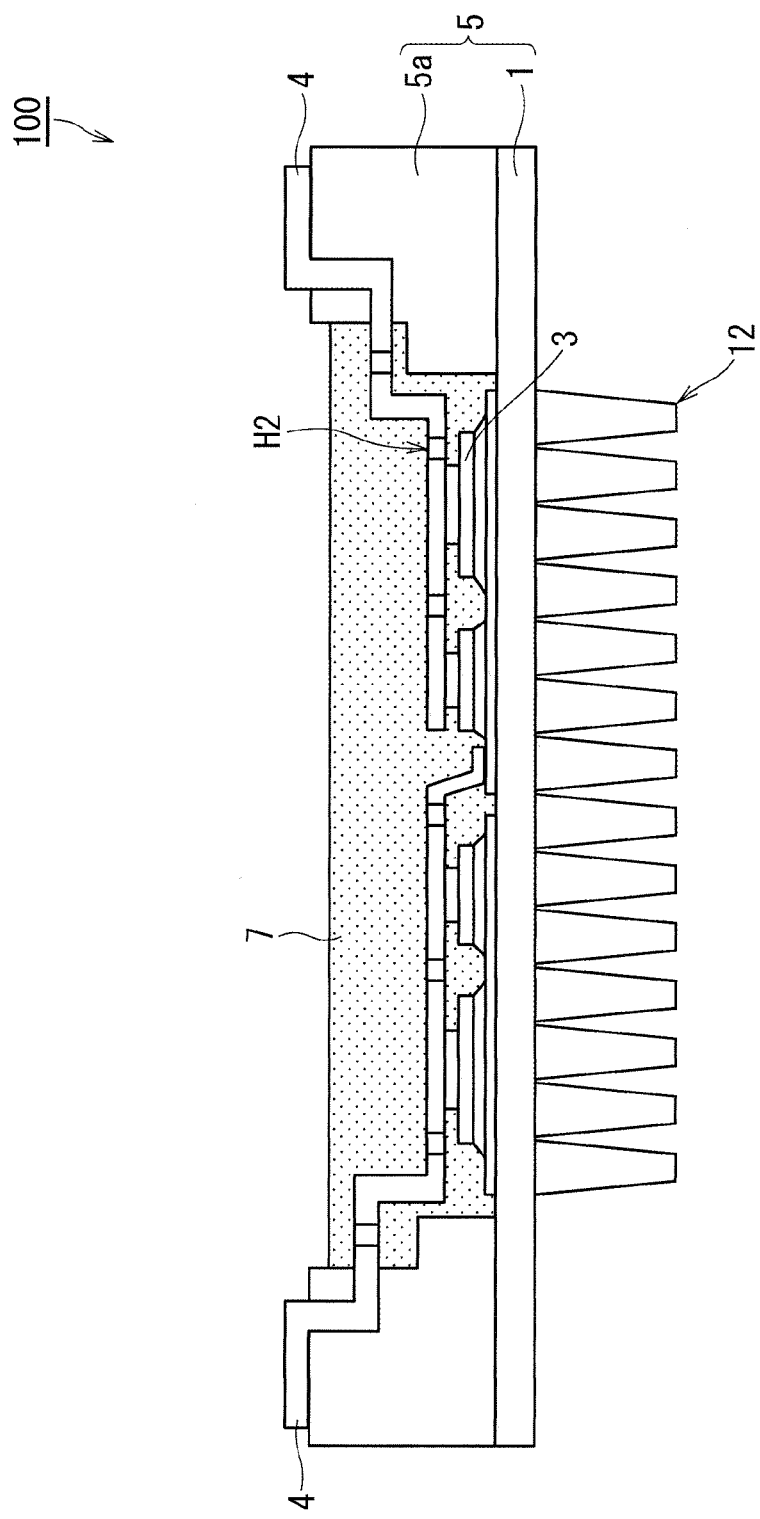
FIG. 17 is a cross sectional view of the semiconductor device according to a fourth preferred embodiment of the present invention.
Figure 18:
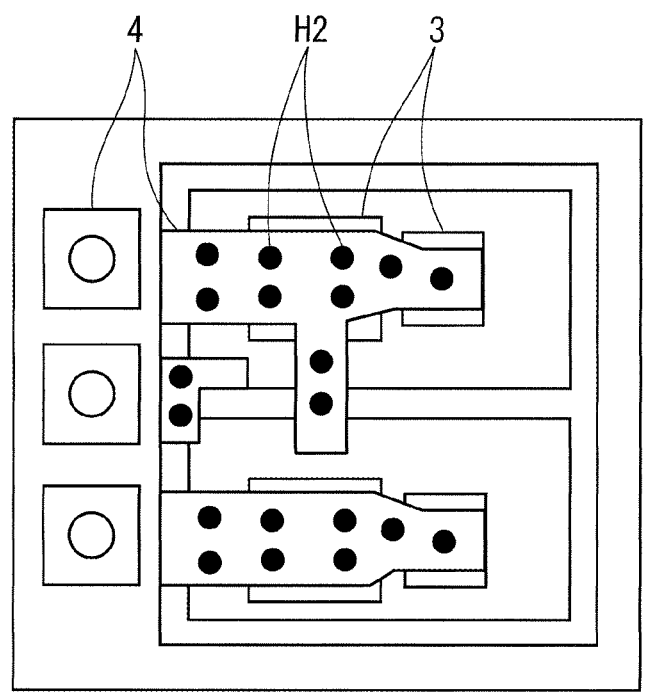
FIG. 18 is a top view showing a right half of a configuration as shown in FIG. 17.

FIG. 17 is a cross sectional view of the semiconductor device 100 according to a fourth preferred embodiment of the present invention. Specifically, FIG. 17 is the cross sectional view of the configuration in which the lead terminal 4 is provided with the through-hole. FIG. 18 is a top view showing a right-half of the configuration as shown in FIG. 17. To simplify the diagram, FIG. 18 does not show the sealing material 7.

With reference to FIGS. 17 and 18, a portion of the lead terminal 4 which the sealing material 7 comes in contact with is provided with a through-hole H2. The through-hole H2 is provided in part (joint) of the lead terminal 4 joining the semiconductor elements 3. The sealing material 7 fills the inside of the through-hole H2.

For example, the lead terminal 4 is made of Cu (copper). The lead terminal 4 has a linear expansion coefficient of 16.7 ppm/° C. The linear expansion coefficient of the sealing material 7 is adjustable in the manufacturing process.

However, if the linear expansion coefficient of the sealing material 7 is set in accordance with the linear expansion coefficient of Cu, the difference between the linear expansion coefficient of the sealing material 7 and 4 to 7 ppm/° C. of the substrate 2 (ceramic) below the semiconductor elements 3 becomes greater. In this case, a separation and the like may occur.

If the sealing material 7 is set to have the linear expansion coefficient (10 to 13 ppm/° C.) close to the linear expansion coefficient of ceramic, the difference between the linear expansion coefficient of the sealing material 7 and that of Cu becomes greater. In this case, adhesion properties between the sealing material 7 and the lead terminal 4 deteriorate.

In the present preferred embodiment, the lead terminal 4 is provided with a plurality of through-holes H2. The sealing material 7 fills the inside of each through-hole H2. Thus, the sealing material 7 is fixed to the lead terminal 4 with reliability. As a result, a separation due to the difference between the linear expansion coefficient of the sealing material 7 and that of the lead terminal 4 can be suppressed.

In particular, a configuration in which the through-holes H2 are provided around the portion of the lead terminal 4 joining the semiconductor elements 3 is effective in improving the reliability of the joints. Thus, the semiconductor device 100 made of mainly silicon carbide (SiC) can be operated at high temperatures with stability.

According to the present preferred embodiment, a joint strength between the lead terminal 4 and the sealing material 7 can be improved. This can prevent moisture from entering between the lead terminal 4 and the sealing material 7. As a result, the reliability of the semiconductor device 100 can be improved.

If the modified configuration D is applied to the first to third preferred embodiments, the joint state of the semiconductor elements 3 and the lead terminal 4 can be improved. As a result, the semiconductor device with higher reliability can be provided.

Figure 19:
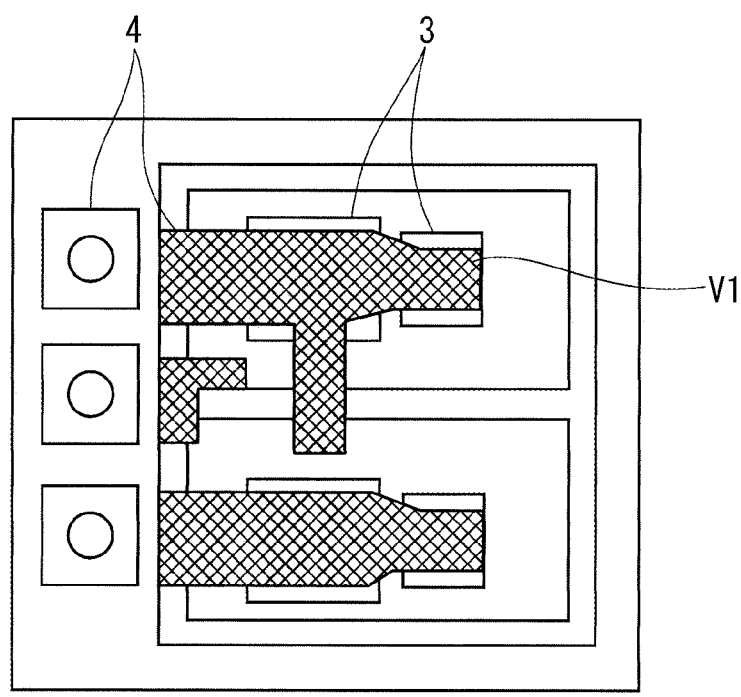
FIGS. 19 and 20 are top views showing modifications of the lead terminal according to the fourth preferred embodiment of the present invention.

As shown in FIG. 19, a portion of the lead terminal 4, which the sealing material 7 comes in contact with, may be configured to be provided with a concave portion V1 (hereinafter, also referred to as a modified configuration E). The concave portion V1 is a groove. The concave portion V1 is not limited to the groove, and it may be a concave-convex portion having a concave-convex shape.

The modified configuration E increases a joint area between the lead terminal 4 and the sealing material 7. This can improve adhesion strength between the lead terminal 4 and the sealing material 7. In other words, the joint strength between the lead terminal 4 and the sealing material 7 can be improved. For this reason, moisture can be prevented from entering between the lead terminal 4 and the sealing material 7. As a result, the reliability of the semiconductor device 100 can be improved.

An anchor effect on a parallel direction with respect to the lead terminal 4 is produced, so that the similar effects can be obtained.

The modified configuration E may be applied to any of the first preferred embodiment, the first and second modifications of the first preferred embodiment, and the second and third preferred embodiments.

Figure 20:
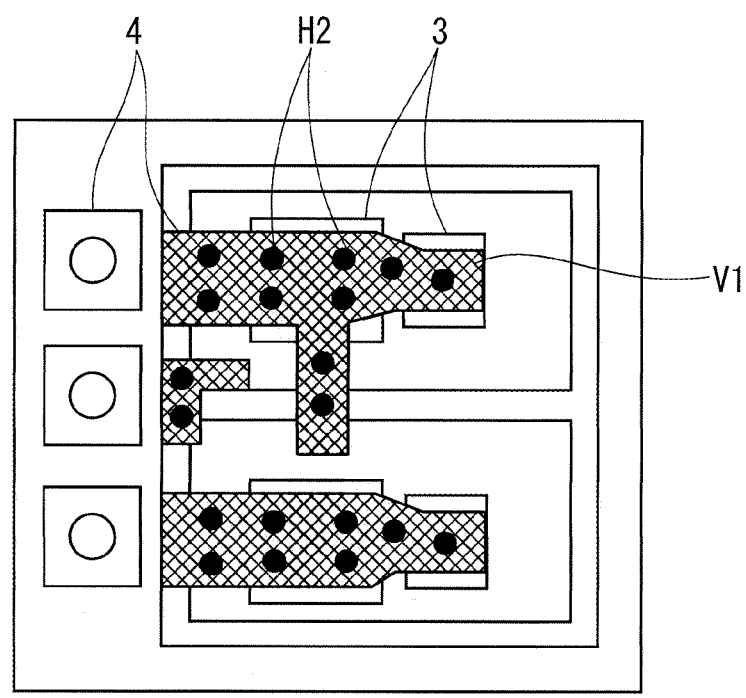

As shown in FIG. 20, the modified configuration D and the modified configuration E may be configured to be combined. With this configuration, the joint strength between the lead terminal 4 and the sealing material 7 can be more improved.

The configuration in which the modified configuration D and the modified configuration E are combined may be applied to any of the first preferred embodiment, the first and second modifications of the first preferred embodiment, and the second and third preferred embodiments.

In addition, according to the present invention, the above preferred embodiments and the modifications of the preferred embodiments can be arbitrarily combined, or each preferred embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
   a conductive portion including a semiconductor element provided on a substrate;
   a case housing said conductive portion; and
   a lead terminal integrated into said case to be directly connected to said semiconductor element or an interconnection of said substrate,
   wherein said lead terminal has a stress relief shape for relieving stress generated in said lead terminal,
   wherein said lead terminal includes a first portion and a second portion, said first portion and said second portion having said stress relief shape,
   wherein said first portion of said lead terminal is buried in said case, and
   wherein said second portion of said lead terminal is located between said case and said semiconductor element.

2. The semiconductor device according to claim 1, wherein said stress relief shape has a crank shape or a bend shape.

3. The semiconductor device according to claim 1, wherein
   said semiconductor device is configured to be freely connected to an external terminal,
   an end of said lead terminal is exposed to the outside of said case, and
   said case exposed to the outside is integrated with an external connection part for connecting said external terminal to the end of said lead terminal.

4. The semiconductor device according to claim 1, wherein the other end of said lead terminal is buried in said case.

5. The semiconductor device according to claim 1, wherein said lead terminal is provided with a slit.

6. The semiconductor device according to claim 1, further comprising a sealing material,
   wherein said sealing material seals said conductive portion and part of said lead terminal.

7. The semiconductor device according to claim 6, wherein in said case, a portion of said lead terminal to which said conductive portion is connected is sealed with said sealing material.

8. The semiconductor device according to claim 7, wherein said sealing material is made of a material different from that of said case.

9. The semiconductor device according to claim 6, wherein a portion of said lead terminal which said sealing material comes in contact with is provided with a through-hole.

10. The semiconductor device according to claim 6, wherein a portion of said lead terminal which said sealing material comes in contact with is provided with a concave portion.

11. The semiconductor device according to claim 1, wherein said semiconductor element is a wide band gap power semiconductor element.

* * * * *